United States Patent
Koshino et al.

(10) Patent No.: US 10,858,509 B2
(45) Date of Patent: Dec. 8, 2020

(54) RESIN COMPOSITION, CURED FILM, METHOD FOR PRODUCING CURED FILM, AND DISPLAY DEVICE

(71) Applicant: Toray Industries, Inc., Tokyo (JP)

(72) Inventors: Mika Koshino, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 113 days.

(21) Appl. No.: 16/307,064

(22) PCT Filed: May 18, 2017

(86) PCT No.: PCT/JP2017/018628
§ 371 (c)(1),
(2) Date: Dec. 4, 2018

(87) PCT Pub. No.: WO2017/217178
PCT Pub. Date: Dec. 21, 2017

(65) Prior Publication Data
US 2019/0136034 A1  May 9, 2019

(30) Foreign Application Priority Data

Jun. 17, 2016  (JP) .................... 2016-120551

(51) Int. Cl.
| | |
|---|---|
| C08L 33/08 | (2006.01) |
| C08L 101/00 | (2006.01) |
| C08L 33/00 | (2006.01) |
| G02B 5/22 | (2006.01) |
| C09D 133/00 | (2006.01) |
| C09D 201/00 | (2006.01) |
| C03C 17/32 | (2006.01) |
| H01L 51/52 | (2006.01) |
| G02B 5/20 | (2006.01) |
| C08K 5/3492 | (2006.01) |
| C08K 5/00 | (2006.01) |
| G02F 1/1333 | (2006.01) |
| G02F 1/1335 | (2006.01) |

(52) U.S. Cl.
CPC ............ *C08L 33/08* (2013.01); *C03C 17/32* (2013.01); *C08L 33/00* (2013.01); *C08L 101/00* (2013.01); *C09D 133/00* (2013.01); *C09D 201/00* (2013.01); *G02B 5/20* (2013.01); *G02B 5/22* (2013.01); *H01L 51/5253* (2013.01); *C03C 2217/74* (2013.01); *C08K 5/0041* (2013.01); *C08K 5/3492* (2013.01); *C08K 2201/014* (2013.01); *C08L 2203/16* (2013.01); *C08L 2203/20* (2013.01); *G02F 1/13338* (2013.01); *G02F 1/133514* (2013.01)

(58) Field of Classification Search
CPC .. C08F 8/14; C08L 33/00; C08L 33/08; C08L 101/00
See application file for complete search history.

(56) References Cited

U.S. PATENT DOCUMENTS

| | | | | |
|---|---|---|---|---|
| 5,952,096 | A * | 9/1999 | Yamashita | ........... C08K 5/3475 264/176.1 |
| 6,083,665 | A | 7/2000 | Sato et al. | |
| 2012/0302676 | A1* | 11/2012 | Oya | .......................... C08J 5/18 524/89 |
| 2017/0242164 | A1* | 8/2017 | O'Neill | .................. G02B 5/208 |

FOREIGN PATENT DOCUMENTS

| | | | |
|---|---|---|---|
| JP | 07292313 | A | 11/1995 |
| JP | 08113704 | A | 5/1996 |
| JP | 1090880 | A | 4/1998 |
| JP | 2009096955 | A | 5/2009 |
| JP | 2011518343 | A | 6/2011 |
| JP | 2011148865 | A | 8/2011 |
| JP | 2011190308 | A | 9/2011 |
| JP | 2013194136 | A | 9/2013 |
| JP | 2014069564 | A | 4/2014 |
| JP | 2014140973 | A | 8/2014 |
| JP | 2015059128 | A | 3/2015 |
| JP | 2015165301 | A | 9/2015 |
| JP | 2016190487 | A | 11/2016 |
| WO | 2008028217 | A1 | 3/2008 |
| WO | WO-2009112425 | A1 * | 9/2009 ............... G02B 1/04 |
| WO | 2010044347 | A1 | 4/2010 |

OTHER PUBLICATIONS

International Search Report and Written Opinion for International Application No. PCT/JP2017/018628, dated Aug. 15, 2017—10 pages.

* cited by examiner

*Primary Examiner* — Mark S Kaucher
(74) *Attorney, Agent, or Firm* — RatnerPrestia

(57) ABSTRACT

Provided is a resin composition which contains a UV absorbent having high solubility in solvents, and imparts superior UV-cut performance and transparency, and good weather resistance, even when being formed as a thin film. The resin composition contains a UV absorbent (a) and a resin (b), wherein the UV absorbent (a) contains at least two compounds, i.e., a compound (a-1) having a global absorption maximum at less than 340 nm, and a compound (a-2) having a global absorption maximum at 340-380 nm, and the total content of (a-1) and (a-2) is 10-30 mass % of the total solid content.

20 Claims, No Drawings

RESIN COMPOSITION, CURED FILM, METHOD FOR PRODUCING CURED FILM, AND DISPLAY DEVICE

CROSS REFERENCE TO RELATED APPLICATIONS

This is the U.S. National Phase application of PCT/JP2017/018628, filed May 18, 2017, which claims priority to Japanese Patent Application No. 2016-120551, filed Jun. 17, 2016, the disclosures of these applications being incorporated herein by reference in their entireties for all purposes.

FIELD OF THE INVENTION

The invention relates to a resin composition, a cured film, a production method for the cured film, and a display device.

BACKGROUND OF THE INVENTION

Presently, display modules of smart phones, tablet terminals, large-size monitors, etc. have become widespread. These appliances are often used outdoors and strongly affected by sunlight. It is generally known that ultraviolet radiation contained in sunlight is harmful. As for display modules, too, there is risk that ultraviolet radiation may cause degradation of display elements or malfunction of drive devices, and therefore adverse effects of ultraviolet radiation cannot be ignored. Furthermore, display modules include many functional films that are provided not only in touch panels but also as polarization light films and phase difference films. In recent years, simplification and unification of functional layers are being progressively considered, and there is a growing demand for protecting from ultraviolet radiation the functional layers that are being improved in performance and diversified in function.

As ultraviolet radiation-cut materials, there are known a surface coating agent for painting motor vehicles and the like (refer to, e.g., Patent Document 1) and an ultraviolet radiation protective film (refer to, e.g., Patent Document 2). However, these technologies require a film thickness of 10 to several ten m in order to obtain a sufficient ultraviolet radiation-cut property, giving rise to a problem of being unable to be compatible with device constructions whose thickness reduction is in progress.

Furthermore, although an antireflection film (refer to, e.g., Patent Document 3) is known as a material that, in thin films, has ultraviolet radiation-cut property, it has been difficult to achieve both good ultraviolet radiation-cut property and good transparency in visible light region.

For the problems of these technologies, development of a novel ultraviolet radiation absorbing agent (refer to, e.g., Patent Document 4) and development of a novel laminate (refer to, e.g., Patent Document 5) are in progress. However, each of these technologies alone is insufficient to attain a film that is thin but sufficient in ultraviolet radiation-cut property and long-term weather resistance.

PATENT DOCUMENTS

Patent Document 1: Japanese Unexamined Patent Publication (Kokai) No. HEI 07-292313
Patent Document 2: Japanese Unexamined Patent Publication (Kokai) No. HEI 08-113704
Patent Document 3: Japanese Unexamined Patent Publication (Kokai) No. HEI 10-090880
Patent Document 4: Japanese Unexamined Patent Publication (Kokai) No. 2011-148865
Patent Document 5: Japanese Unexamined Patent Publication (Kokai) No. 2016-190487

SUMMARY OF THE INVENTION

The inventors, considering the foregoing problems, gave ultraviolet radiation-cut property and high weather resistance to a transparent coating agent that is being widely used as protection films or insulation films for smart phones and tablet terminals and therefore made this invention.

That is, it is an object of the invention to provide a resin composition that achieves both good ultraviolet radiation-cut property and good transparency in a thin film of 5 μm or less and therefore provides a cured film excellent in weather resistance.

The object of the invention is achieved by a resin composition, a cured film, a production method for the cured film, or a display device described below. That is, (1) A resin composition containing an (a) ultraviolet radiation absorbing agent and a (b) resin, the (a) ultraviolet radiation absorbing agent containing at least two species mentioned below:

a (a-1) compound having a greatest absorption maximum below 340 nm; and a (a-2) compound having a greatest absorption maximum at 340 to 380 nm, wherein the compound of (a-2) contains a compound represented by general formula (1) and a sum content of (a-1) and (a-2) is 10 to 30 mass % of a total amount of solid content.

[CHEM. 1]

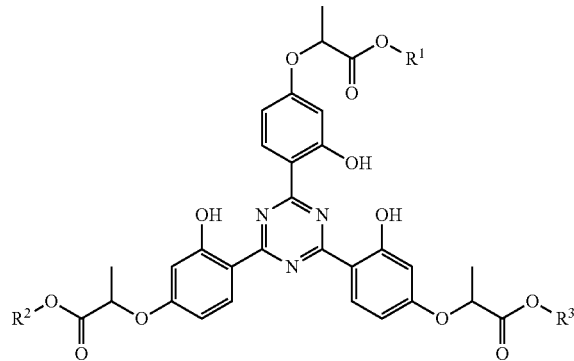

(1)

(In general formula (1), $R^1$ to $R^3$ each independently indicate a hydrocarbon group having a carbon number of 1 to 10.)

(2) A resin composition according to (1), wherein a mass ratio between the content of the compound of (a-1) and the content of the compound of (a-2) is in a range of (a-1):(a-2)=1:1 to 1:10.

(3) A resin composition according to (1) or (2), wherein the (a) ultraviolet radiation absorbing agent contains a compound that has a phenolic hydroxyl group.

(4) A resin composition according to any one of (1) to (3), wherein the (a) ultraviolet radiation absorbing agent contains a triazine based compound.

(5) A resin composition according to any one of (1) to (4), wherein the (b) resin is an acrylic resin.

(6) A resin composition according to (5), wherein the (b) resin has a carboxyl group.

(7) A resin composition according to (5) or (6), wherein a double bond equivalent of the (b) resin is in a range of 700 to 2,300 g/mol.

(8) A resin composition according to any one of (1) to (7), further containing a (c) compound having an alkoxy methyl group or a methylol group.

(9) A resin composition according to (8), wherein the (c) compound having an alkoxy methyl group or a methylol group is a compound that has a group represented by general formula (2).

[CHEM. 2]

$$-N-(CH_2OR^4)_x(H)_y \qquad (2)$$

(In general formula (2), $R^4$ indicates a hydrogen atom or a univalent hydrocarbon group having a carbon number of 1 to 6. x indicates 1 or 2, y indicates 0 or 1, and x+y is 2.)

(10) A resin composition according to (8) or (9), containing in the total amount of solid content:

the (a-1) compound having a greatest absorption maximum below 340 nm in an amount of 1 to 10 mass %;

the (a-2) compound having a greatest absorption maximum at 340 to 380 nm in an amount of 7 to 25 mass %;

the (b) resin in an amount of 50 to 85 mass %; and the (c) compound having an alkoxy methyl group or a methylol group in an amount of 0.5 to 15 mass %.

(11) A cured film provided by curing the resin composition according to any one of (1) to (10).

(12) A cured film according to (11), whose average transmittance values satisfy all of (I) to (III) mentioned below:

(I) an average transmittance value in a wavelength range of 300 to 360 nm is 0.1 to 5%;

(II) an average transmittance value in a wavelength range of 360 to 380 nm is 1 to 30%; and (III) an average transmittance value in a wavelength range of 400 to 500 nm is 90 to 100%.

(13) A cured film according to (12), whose film thickness is 0.5 to 5 μm.

(14) A production method for a cured film in which the cured film is formed by applying the resin composition according to any one of (1) to (10) onto a substrate and performing a heating treatment at 100 to 250° C.

(15) A display device including the cured film according to any one of (11) to (13).

(16) A cover glass including a cured film according to any one of (11) to (13).

(17) A color filter including a cured film according to any one of (11) to (13).

(18) A touch panel including a cured film according to any one of (11) to (13).

The resin composition of the invention is high in the solvent solubility for an ultraviolet radiation absorbing agent and can provide a cured film that is a thin film and excellent in ultraviolet radiation-cut property and transparency and that has good weather resistance.

DETAILED DESCRIPTION OF EMBODIMENTS OF THE INVENTION

The resin composition of the invention contains an (a) ultraviolet radiation absorbing agent and a (b) resin. It is preferable that the resin composition further contain a (c) compound having an alkoxy methyl group or a methylol group.

[(a) Ultraviolet Radiation Absorbing Agent]

The resin composition of the invention contains an (a) ultraviolet radiation absorbing agent. The (a) ultraviolet radiation absorbing agent contains at least two species: a (a-1) compound having a greatest absorption maximum below 340 nm (hereinafter, also referred to simply as compound of (a-1)) and a (a-2) compound having a greatest absorption maximum at 340 to 380 nm (hereinafter, also referred to simply as compound of (a-2)). The ultraviolet radiation-cut property is obtained mainly because the compound of (a-2) is contained. However, since these compounds are easily decomposed by ultraviolet radiation having a short wavelength less than 340 nm, the combined use of the compound of (a-1) inhibits the decomposition of the compound of (a-2), so that good ultraviolet radiation-cut property and weather resistance can both be achieved.

As the (a) ultraviolet radiation absorbing agent, for example, benzophenone-based compounds, benzotriazole-based compounds, and triazine based compounds can be cited. The kind of (a) ultraviolet radiation absorbing agent that can be used is not limited; however, a compound having a phenolic hydroxyl group is preferable. Due to having a phenolic hydroxyl group, the compound undergoes crosslinking reaction with the (c) compound having an alkoxy methyl group or a methylol group during a heating treatment as described later. The crosslinking will inhibit the bleed out of the ultraviolet radiation absorbing agent at the time of a heating treatment and during long-term storage of cured films. Furthermore, because of good heat resistance, a triazine based compound is more preferably used.

As preferable examples of the (a) ultraviolet radiation absorbing agent, (a-1) compounds having a greatest absorption maximum below 340 nm and (a-2) compounds having a greatest absorption maximum at 340 to 380 nm will be cited below although the (a) ultraviolet radiation absorbing agent is not limited to them.

As (a-1) compounds having a greatest absorption maximum below 340 nm, benzophenone-based compounds, including 2,4-dihydroxybenzophenone, 2-hydroxy-4-methoxybenzophenone, 2-hydroxy-4-methoxybenzophenone-5-sulfonic acid trihydrate, 2-hydroxy-4-octyloxybenzophenone, 4-dodecyloxy-2-hydroxybenzophenone, 4-benzyloxy-2-hydroxybenzophenone, and 1,4-bis(4-benzoyl-3-hydroxy phenoxy)-butane, and triazine compounds, including 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-(2'-ethyl)hexyl)oxy]-2-hydroxyphenyl]-4,6-bis(2,4-dimethylphenyl)-1,3,5-triazine, 2-(4-propionic acid octyl ester-2-hydroxyphenyl)-4,6-biphenyl-1,3,5-triazine, etc., can be cited.

As (a-2) compounds having a greatest absorption maximum at 340 to 380 nm, benzophenone-based compounds, including 2,2',4,4'-tetrahydroxybenzophenone and 2,2'-dihydroxy-4,4'-dimethoxybenzophenone, benzotriazole-based compounds, including 2-(2-hydroxy-5-tert-butylphenyl)-2H-benzotriazole, 2-[5-chloro-(2H)-benzotriazole-2-yl]-4-methyl-6-(tert-butyl)phenol, 2-(2H-benzotriazole-2-yl)-4,6-di-tert-pentyl phenol, 2-(2-hydroxy-5-methylphenyl)-2H-benzotriazole, 2-(2H-benzotriazole-2-yl)-4-methyl-6-(3,4,5,6-tetrahydrophthalimidylmethyl)phenol, 2-(2-hydroxy-4-octyloxyphenyl)-2H-benzotriazole, 2-(2-hydroxy-5-tert-octylphenyl)-2H-benzotriazole, 2-(2-hydroxy-5-methylphenyl)benzotriazole, 2-(2,4-dihydroxyphenyl)-2H-benzotriazole, 2-(4-ethoxy-2-hydroxyphenyl)-2H-benzotriazole, 2-(4-butoxy-2-hydroxyphenyl)-2H- benzotriazole, 2-(2H-benzotriazole-2-yl)-4,6-bis(1-methyl-1-phenylethyl)phenol, 2-(2H-benzotriazole-2-yl)-6-(1-methyl-1-phenylethyl)-4-(1,1,3,3-tetramethylbutyl)phenol, and triazine based compounds, including 2,4-bis(2-hydroxy-4-butyloxyphenyl)-6-(2,4-bis-butyloxyphenyl)-1,3,5-triazine, 2,4,6-tris(4-propionic acid octyl ester-2-hydroxyphenyl)-1,3,5-triazine, etc., can be cited.

The resin composition of the invention contains as a (a-2) compound having a greatest absorption maximum at 340 to 380 nm a compound represented by general formula (1).

[CHEM. 3]

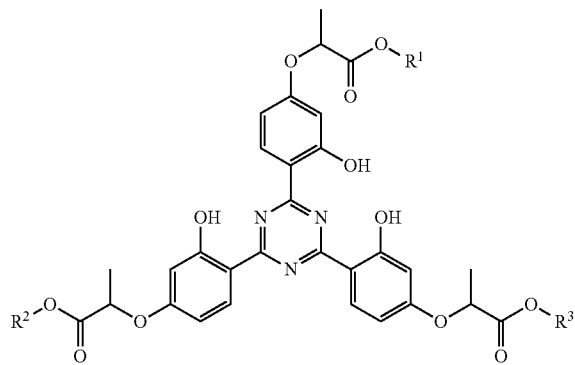

(1)

In the foregoing formula, $R^1$ to $R^3$ each independently indicate a hydrocarbon group having a carbon number of 1 to 10.

The compound represented by the general formula (1) is high in the solubility in organic solvents and also high in the absorbance at wavelength of 360 to 380 nm and high in the transparency in a visible light region greater than or equal to 400 nm; therefore, it is particularly preferably used.

A preferred example of the compound represented by the general formula (1) is indicated below.

[CHEM. 4]

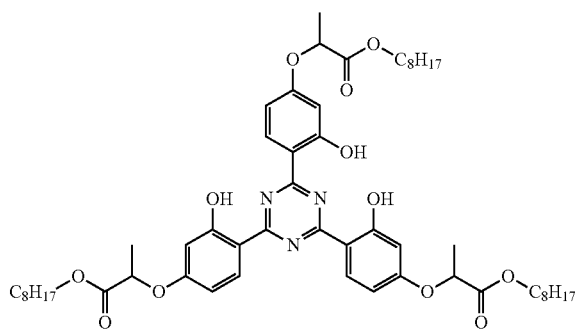

In the resin composition of the invention, the content of the (a) ultraviolet radiation absorbing agent is 10 to 30 mass % in the total amount of solid content. Because it is contained at a high concentration greater than or equal to 10 mass % in the total amount of solid content, it is possible to reduce the transmittance in a wavelength range less than or equal to 380 nm and attain good ultraviolet radiation-cut property even in a thin film. Furthermore, when the content thereof exceeds 30 mass %, the transmittance in a visible light region greater than or equal to 400 nm becomes low or the bleeding-out of the ultraviolet radiation absorbing agent occurs, causing appearance defect of the cured film and deterioration of weather resistance. Therefore, the content thereof exceeding 30 mass % is not preferable.

As for the mass ratio between the content of the compound of (a-1) and the content of the compound of (a-2) in the (a) ultraviolet radiation absorbing agent, a range of (a-1):(a-2)=1:1 to 1:10 is preferable. More preferable is a range of (a-1):(a-2)=1:2 to 1:6. Furthermore, it is preferable that the content of the compound of (a-1) be 1 to 10 mass % and the content of the compound of (a-2) be 7 to 25 mass %. By setting the mass ratio and the contents in these ranges, the weather resistance improvement effect of the compound of (a-1) and the ultraviolet radiation-cut effect of the compound of (a-2) can be maintained in good balance. Incidentally, in the case where two or more species of each of the compound of (a-1) and the compound of (a-2) are contained, it is preferable that the total amounts thereof be within the range mentioned above.

[(b) Resin]

The resin composition of the invention contains a (b) resin. The (b) resin may be either one of natural and synthetic polymers. For example, acrylic resin, polyolefin, polyether, polyamide, polyimide, polyurethane, polyurea, polyester, polycarbonate, phenol resin, melamine resin, cellulose ester, polysiloxane, natural polymers (e.g., cellulose, rubber, gelatin, etc.), etc. can be cited.

Among these, acrylic resin is preferable because of being good in compatibility with the (a) ultraviolet radiation absorbing agent. Preferable examples of the acrylic resin are cited below. However, the acrylic resin is not limited to these.

As the acrylic resin, for example, acrylic resins containing an ethylenic unsaturated group and a carboxyl group which are obtained by carrying out radical polymerization of an unsaturated carboxylic acid and an ethylenic unsaturated compound to obtain a resin having carboxyl groups and then carrying out a reaction of adding an epoxy compound having an ethylenic unsaturated double bond group to some of the carboxyl groups to achieve esterification can be cited.

As for the catalyst for the radical polymerization, there is no particular restriction and azo compounds, such as azobisisobutyronitrile, and organic peroxides, such as benzoyl peroxide, among others, are generally used.

As for the catalyst for use in the addition reaction of the epoxy compound having an ethylenic unsaturated double bond group, there is no particular restriction and known catalysts can be used. For example, amino based catalysts, such as dimethylaniline, 2,4,6-tris(dimethylaminomethyl)phenol, and dimethylbenzylamine, tin based catalysts, such as tin(II) 2-ethylhexanoate and dibutyltin laurate, titanium based catalysts, such as 2-ethylhexanoic acid titanium(IV), phosphorus based catalysts, such as triphenylphosphine, chromium based catalysts, such as acetylacetonate chromium and chromium chloride, etc. can be used.

As the unsaturated carboxylic acid, for example, (meth)acrylic acid, itaconic acid, crotonic acid, maleic acid, fumaric acid, or vinyl acetic acid can be cited.

As the ethylenic unsaturated compound, for example, an unsaturated carboxylic acid alkyl ester, such as methyl (meth)acrylate, ethyl (meth)acrylate, n-propyl (meth)acrylate, isopropyl (meth)acrylate, n-butyl (meth)acrylate, sec-butyl (meth)acrylate, iso-butyl (meth)acrylate, tert-butyl (meth)acrylate, n-pentyl (meth)acrylate, 2-hydroxyethyl (meth)acrylate, or benzyl (meth)acrylate, an aromatic vinyl compound, such as styrene, p-methylstyrene, o-methylstyrene, m-methylstyrene, or α-methylstyrene, an unsaturated carboxylic acid aminoalkyl ester, such as aminoethyl acrylate, an unsaturated carboxylic acid glycidyl ester, such as glycidyl (meth)acrylate, a carboxylic acid vinyl ester, such as vinyl acetate or propionic acid vinyl, a vinyl cyanide compound, such as (meth)acrylonitrile or α-chloroacrylonitrile, an aliphatic conjugated diene, such as 1,3-butadiene or isoprene, and a polystyrene, a polymethyl acrylate, a polymethyl methacrylate, a polybutyl acrylate, and a polybutyl methacrylate which have (meth)acryloyl groups on their ends, among others, can be cited.

As the epoxy compound having an ethylenic unsaturated double bond group, for example, glycidyl (meth)acrylate, α-ethylglycidyl (meth)acrylate, α-n-propylglycidyl (meth)acrylate, α-n-butylglycidyl (meth)acrylate, 3,4-epoxybutyl (meth)acrylate, 3,4-epoxyheptyl (meth)acrylate, α-ethyl-6,7-epoxyheptyl (meth)acrylate, allylglycidyl ether, vinylglycidyl ether, o-vinylbenzylglycidyl ether, m-vinylbenzylglycidyl ether, p-vinylbenzylglycidyl ether, α-methyl-o-vinylbenzylglycidyl ether, α-methyl-m-vinylbenzylglycidyl ether, α-methyl-p-vinylbenzylglycidyl ether, 2,3-diglycidyloxymethylstyrene, 2,4-diglycidyloxymethylstyrene, 2,5-diglycidyloxymethylstyrene, 2,6-diglycidyloxymethylstyrene, 2,3,4-triglycidyloxymethylstyrene, 2,3,5-triglycidyloxymethylstyrene, 2,3,6-triglycidyloxymethylstyrene, 3,4,5-triglycidyloxymethylstyrene, 2,4,6-triglycidyloxymethylstyrene, 3,4-epoxy cyclohexylmethyl methacrylate, etc. can be cited.

Among the acrylic resins, a resin having a carboxyl group is particularly preferable. Because of having a carboxyl group, the resin undergoes, during the heating treatment, a crosslinking reaction with the (c) compound having an alkoxy methyl group or a methylol group described below. Crosslinking reactions between the (a) ultraviolet radiation absorbing agent and the (c) compound having an alkoxy methyl group or a methylol group and between the (b) resin and the (c) compound having an alkoxy methyl group or a methylol group occur, so that the crosslink density of the cured film increases and the weather resistance drastically improves, which is preferable.

The double bond equivalent of the acrylic resin is not particularly restricted. However, it is preferable that the double bond equivalent thereof be in the range of 700 to 2,300 g/mol and it is more preferable that the double bond equivalent is in the range of 800 to 1,500 g/mol. If the double bond equivalent thereof is 700 g/mol or greater, the compatibility with the (a) ultraviolet radiation absorbing agent further improves, and therefore the breeding-out of the ultraviolet radiation absorbing agent and the appearance defect of the cured film can be further inhibited. On the other hand, if the double bond equivalent is 2,300 g/mol or less, the crosslink density of the cured film increases, and therefore the hardness and the weather resistance can be further improved.

The weight-average molecular weight (Mw) of the (b) resin is not particularly restricted. However, it is preferable that the weight-average molecular weight (Mw) thereof be greater than or equal to 1,000 and less than or equal to 100,000 as a polystyrene-converted value measured by gel permeation chromatography (GPC). By setting Mw in the foregoing range, a good painting property can be obtained.

In the resin composition of the invention, the content of the (b) resin is not particularly restricted, and can be arbitrarily selected according to a desired film thickness or use; however, it is preferable that the content of the (b) resin be 50 to 85 mass % in the total amount of solid content. By setting it in this range, a cured film whose weather resistance and reliability are good can be obtained.

[(c) Compound Having an Alkoxy Methyl Group or a Methylol Group]

It is preferable that the resin composition of the invention contain a (c) compound having an alkoxy methyl group or a methylol group. As the (c) compound having an alkoxy methyl group or a methylol group, for example, a methylol compound obtained by reacting a phenol compound with a formalin aqueous solution, an alkoxy methyl compound obtained by alkoxylating a methylol compound with alcohol, or a compound represented by general formula (2), etc. can be cited. Among these, because of being good in the compatibility with the (a) ultraviolet radiation absorbing agent, the following compound

[CHEM. 5]

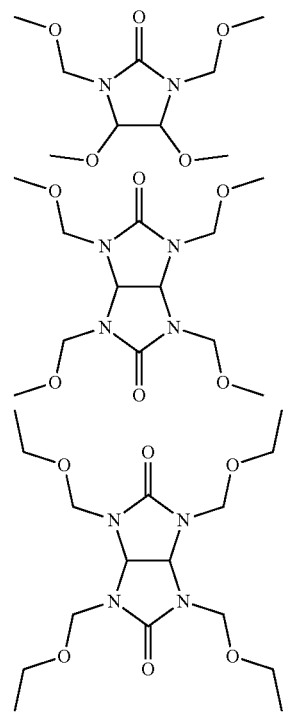

or the following compound represented by general formula (2) is preferable.

[CHEM. 6]

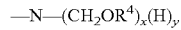

(2)

In the formula, $R^4$ indicates a hydrogen atom or a univalent hydrocarbon group having a carbon number of 1 to 6. x indicates 1 or 2, y indicates 0 or 1, and x+y is 2.

In the foregoing general formula (2), although $R^4$ is a hydrogen atom or a univalent hydrocarbon group having a carbon number of 1 to 6, it is preferable that $R^4$ be a univalent hydrocarbon group having a carbon number of 1 to 4. Furthermore, from the viewpoint of the stability of the compound and the preservation stability in a resin composition, it is preferable that $R^4$ be a methyl group or an ethyl group and it is preferable that the number of $(CH_2OR^4)$ groups contained in the compound be 8 or less.

Preferable examples of the compound having a group represented by the general formula (2) are indicated below.

[CHEM. 7]

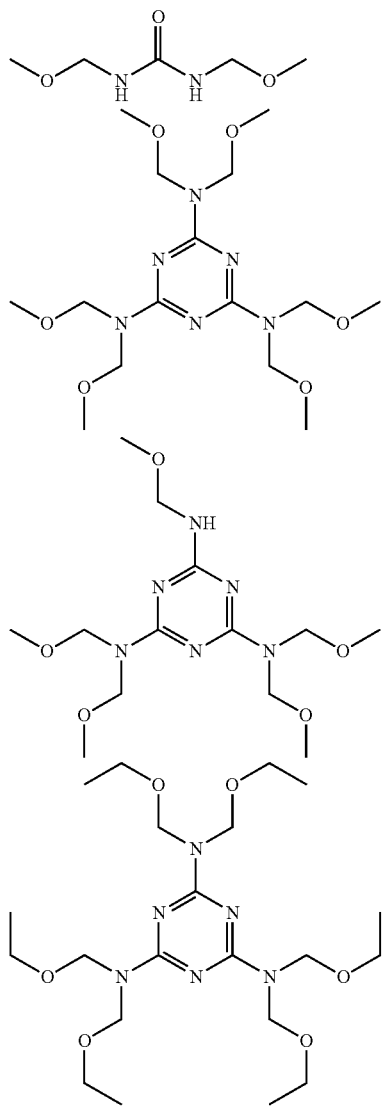

In the case where the resin composition of the invention contains a (c) compound having an alkoxy methyl group or a methylol group, it is preferable that the content thereof be 0.5 to 15 mass % in the total amount of solid content. It is particularly preferable that the content thereof be 3 to 10 mass %. As the (c) compound is contained in an amount of 0.5 mass % or greater, the crosslink density of the cured film becomes high and the weather resistance improves. On the other hand, it is preferable that the content thereof be less than or equal to 15 mass % from the viewpoint of preservation stability of the resin composition.

The resin composition of the invention may contain a light stabilizing agent. As an appropriate amount of a light stabilizing agent is contained, the weather resistance of the cured film obtained improves. As for the light stabilizing agent, there is not particular limitation and known agents can be used. As commercially sold light stabilizing agents, Tinuvin (registered trademark) "111FL (trade name)", "123 (trade name)", "144 (trade name)" "292 (trade name)", and "5100 (trade name)" (which are made by BASF Japan Ltd.), "ADEKA STAB LA-52 (trade name)", "ADEKA STAB LA-72 (trade name)", "ADEKA STAB LA-81 (trade name)", and "ADEKA STAB LA-82 (trade name)" (which are made by ADEKA Corporation), etc. can be cited.

The resin composition of the invention may contain a polyfunctional monomer for the purpose of adjusting the degree of cure of the cured film obtained. The polyfunctional monomer refers to a compound having in the molecule at least two or more ethylenic unsaturated double bonds. Considering the ease of radical polymerization property, a polyfunctional monomer having a (meth)acryloyl group is preferable. Concrete examples of the polyfunctional monomer are cited below. However, the polyfunctional monomer is not limited to these.

As a polymerizable compound having in its molecule two (meth)acryloyl groups, for example, 1,3-butanediol di(meth)acrylate, 1,4-butanediol di(meth)acrylate, 1,6-hexanediol di(meth)acrylate, 1,9-nonanediol di(meth)acrylate, 1,10-decanediol di(meth)acrylate, neopentylglycol di(meth)acrylate, 2,4-dimethyl-1,5-pentanediol di(meth)acrylate, butyl ethyl propanediol di(meth)acrylate, ethocylated cyclohexane methanol di(meth)acrylate, polyethylene glycol di(meth)acrylate, oligoethylene glycol di(meth)acrylate, dipropylene glycol di(meth)acrylate, polypropylene glycol di(meth)acrylate, 2-ethyl-2-butyl-propanediol di(meth)acrylate, 2-ethyl-2-butyl-butanediol di(meth)acrylate, hydroxy pivalic acid neopentylglycol di(meth)acrylate, EO-modified bisphenol A di(meth)acrylate, bisphenol F polyethoxy di(meth)acrylate, oligopropylene glycol di(meth)acrylate, propoxylated ethoxylated bisphenol A di(meth)acrylate, tricyclodecane di(meth)acrylate, bis(2-hydroxyethyl)isocyanurate di(meth)acrylate, ethoxylated bisphenol A diacrylate, 9,9-bis[4-(2-(meth)acryloyloxyethoxy)phenyl]fluorene, 9,9-bis[4-(2-(meth)acryloyloxyethoxy)-3-methylphenyl]fluorene, 9,9-bis[4-(2-(meth)acryloyloxypropoxy)-3-methylphenyl]fluorene, or 9,9-bis[4-(2-(meth)acryloyloxyethoxy)-3,5-dimethylphenyl]fluorene can be cited.

As a polymerizable compound having in its molecule three (meth)acryloyl groups, for example, trimethylol propane tri(meth)acrylate, trimethylol ethane tri(meth)acrylate, an alkylene oxide-modified tri(meth)acrylate of trimethylol propane, pentaerythritol tri(meth)acrylate, dipentaerythritol tri(meth)acrylate, trimethylol propane tri((meth)acryloyloxypropyl)ether, glycerol tri(meth)acrylate, tris(2-hydroxyethyl)isocyanurate tri(meth)acrylate, isocyanuric acid alkylene oxide-modified tri(meth)acrylate, propionic acid dipentaerythritol tri(meth)acrylate, tri((meth)acryloyloxyethyl)isocyanurate, hydroxypivalaldehyde-modified dimethylol propane tri(meth)acrylate, sorbitol tri(meth)acrylate, propoxylated trimethylol propane tri(meth)acrylate, or ethocylated glycerol triacrylate can be cited.

As a polymerizable compound having in its molecule four (meth)acryloyl groups, for example, pentaerythritol tetra (meth)acrylate, sorbitol tetra(meth)acrylate, ditrimethylolpropane tetra(meth)acrylate, propionic acid dipentaerythritol tetra(meth)acrylate, or ethoxylated pentaerythritol tetra (meth)acrylate can be cited.

As a polymerizable compound having in its molecule five (meth)acryloyl groups, for example, sorbitol penta(meth) acrylate or dipentaerythritol penta(meth)acrylate can be cited.

As a polymerizable compound having in its molecule six (meth)acryloyl groups, for example, dipentaerythritol hexa (meth)acrylate, sorbitol hexa(meth)acrylate, an alkylene oxide-modified hexa(meth)acrylate of phosphazene, or caprolactone-modified dipentaerythritol hexa(meth)acrylate can be cited.

As a polymerizable compound having in its molecule seven (meth)acryloyl groups, for example, tripentaerythritol heptaacrylate can be cited.

As a polymerizable compound having in its molecule eight (meth)acryloyl groups, for example, tripentaerythritol octaacrylate can be cited. It is possible to use one of these species or a combination of a plurality of species thereof.

The resin composition of the invention may contain a polymerization initiating agent. The polymerization initiating agent is an agent that decomposes and/or reacts due to heat or light (including ultraviolet radiation and electron radiation) and therefore produces radicals.

As concrete examples thereof, 2-methyl-[4-(methylthio)phenyl]-2-morpholinopropane-1-one, 2-dimethylamino-2-(4-methylbenzyl)-1-(4-morpholine-4-yl-phenyl)-butane-1-one, 2-benzyl-2-dimethylamino-1-(4-morpholinophenyl)-butanone-1, 2,4,6-trimethylbenzoyl phenyl phosphine oxide, bis(2,4,6-trimethylbenzoyl)-phenyl phosphine oxide, bis(2,6-dimethoxybenzoyl)-(2,4,4-trimethylpentyl)-phosphine oxide, 1-phenyl-1,2-propanedione-2-(o-ethoxycarbonyl)oxime, 1,2-octanedione,1-[4-(phenylthio)-2-(O-benzoyloxime)], 1-phenyl-1,2-butadione-2-(o-methoxycarbonyl) oxime, 1,3-diphenylpropane trione-2-(o-ethoxycarbonyl) oxime, ethanone,1-[9-ethyl-6-(2-methylbenzoyl)-9H-carbazol-3-yl]-,1-(0-acetyloxime), 4,4-bis(dimethylamino) benzophenone, 4,4-bis(diethylamino)benzophenone, ethyl p-dimethylaminobenzoate, 2-ethylhexyl-p-dimethylamino benzoate, ethyl p-diethylaminobenzoate, diethoxyacetophenone, 2-hydroxy-2-methyl-1-phenylpropane-1-one, benzyl dimethylketal, 1-(4-isopropyl phenyl)-2-hydroxy-2-methyl-propane-1-one, 4-(2-hydroxyethoxy)phenyl-(2-hydroxy-2-propyl)ketone, 1-hydroxycyclohexyl-phenyl ketone, benzoin, benzoin methyl ether, benzoin ethyl ether, benzoin isopropyl ether, benzoin isobutyl ether, benzophenone, methyl o-benzoyl benzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N-dimethyl-N-[2-(1-oxo-2-propenyl oxy)ethyl]benzene methanaminium bromide, (4-benzoyl benzyl)trimethyl ammonium chloride, 2-hydroxy-3-(4-benzoylphenoxy)-N,N,N-trimethyl-1-propene aminium chloride monohydrate, 2-isopropylthioxanthone, 2,4-dimethylthioxanthone, 2,4-diethyl thioxanthone, 2,4-dichlorothioxanthone, 2-hydroxy-3-(3,4-dimethyl-9-oxo-9H-thioxanthene-2-yloxy)-N,N,N-trimethyl-1-propanaminium chloride, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenyl glyoxylate ester, η5-cyclopentadienyl-η6-cumenyl-iron (1+)-hexafluorophosphate (1−), diphenyl sulfide derivative, bis(η5-2,4-cyclopentadiene-1-yl)-bis(2,6-difluoro-3-(1H-pyrrole-1-yl)-phenyl)titanium, thioxanthone, 2-methylthioxanthone, 2-chlorothioxanthone, 4-benzoyl-4-methylphenyl ketone, dibenzyl ketone, fluorenone, 2,3-diethoxyacetophenone, 2,2-dimethoxy-2-phenyl-2-phenyl acetophenone, 2-hydroxy-2-methyl propiophenone, p-t-butyl dichloroacetophenone, benzyl methoxy ethyl acetal, anthraquinone, 2-t-butyl anthraquinone, 2-aminoanthraquinone, p-chloranthraquinone, anthrone, benzanthrone, dibenzosuberone, methylene anthrone, 4-azidobenzalacetophenone, 2,6-bis(p-azido benzylidene)cyclohexane, 2,6-bis(p-azido benzylidene)-4-methyl cyclohexanone, naphthalenesulfonyl chloride, quinolinesulfonyl chloride, N-phenylthioacridone, benzthiazole disulfide, triphenylphosphine, carbon tetrabromide, tribromophenyl sulfone, and benzoyl peroxide, and combinations of a photoreducing coloring matter, such as eosin or methylene blue, and a reducing agent, such as ascorbic acid or triethanol amine, among others, can be cited. It is possible to use one of these species or a combination of a plurality of species thereof.

The resin composition of the invention may contain an adhesion improving agent. As for the adhesion improving agent, there is no particular restriction and known agents can be used. Particularly, alkoxysilane compounds can be suitably used; for example, vinyltrimethoxysilane, vinyltriethoxysilane, methyltrimethoxysilane, methyltriethoxysilane, ethyltrimethoxysilane, phenyltrimethoxysilane, p-styryltrimethoxysilane, 3-glycidoxypropyltrimethoxysilane, (3,4-epoxycyclohexyl)methyltrimethoxysilane, 3-aminopropyltriethoxysilane, N-phenyl-3-aminopropyltrimethoxysilane, etc. can be cited. It is possible to use one of these species or a combination of a plurality of species thereof.

The resin composition of the invention may contain a solvent. In the resin composition of the invention, a solvent whose boiling point under the atmospheric pressure is 250° C. or less can be suitably used and a plurality of species of such solvents may be used. Furthermore, if a solvent remains in a cured film obtained by curing the resin composition of the invention by heating, the adhesion property with the substrate deteriorates over time. Therefore, in the case where a solvent is contained, it is preferable that a solvent whose boiling point under the atmospheric pressure is 150° C. or less be contained.

As solvents whose boiling point under the atmospheric pressure is 150° C. or less, for example, ethanol, isopropyl alcohol, 1-propyl alcohol, 1-butanol, 2-butanol, isopentyl alcohol, ethylene glycol monomethyl ether, ethylene glycol dimethyl ether, ethylene glycol monoethyl ether, methoxymethyl acetate, propylene glycol monomethyl ether, propylene glycol monoethyl ether, propylene glycol monomethyl ether acetate, propylene glycol monopropyl ether, ethylene glycol monomethyl ether acetate, 1-methoxy propyl-2-acetate, acetol, acetylacetone, methyl isobutyl ketone, methyl ethyl ketone, methyl propyl ketone, methyl lactate, toluene, cyclopentanone, cyclohexane, normal heptane, benzene, methyl acetate, ethyl acetate, propyl acetate, isobutyl acetate, butyl acetate, isopentyl acetate, pentyl acetate, 3-hydroxy-3-methyl-2-butanone, 4-hydroxy-3-methyl-2-butanone, 5-hydroxy-2-pentanone, etc. can be cited.

As solvents whose boiling point under the atmospheric pressure is 150 to 250° C., for example, ethylene glycol diethyl ether, ethylene glycol monobutyl ether, ethylene glycol monobutyl ether acetate, ethylene glycol dibutyl ether, propylene glycol monobutyl ether, propylene glycol monoethyl ether acetate, propylene-glycol monomethyl propionate, diethylene glycol monomethyl ether, diethylene glycol monoethyl ether, diethylene glycol monoethyl ether acetate, diethylene glycol monobutyl ether, diethylene glycol monobutyl ether acetate, diethylene glycol dimethyl ether, diethylene glycol ethyl methyl ether, dipropylene glycol monomethyl ether, dipropylene glycol monomethyl ether acetate, dipropylene glycol monopropyl ether, dipropylene glycol monobutyl ether, dipropylene glycol dimethyl ether, 2-ethoxyethyl acetate, 3-methoxy-1-butanol, 3-methoxy-3-methyl butanol, 3-methoxy-3-methylbutyl acetate, 3-methoxybutyl acetate, ethyl 3-ethoxypropionate, propylene glycol monomethyl ether propionate, dipropylene glycol methyl ether, diisobutyl ketone, diacetone alcohol, ethyl lactate, butyl lactate, dimethylformamide, dimethylacetamide, γ-butyrolactone, γ-valerolactone, δ-valerolactone, propylene carbonate, N-methylpyrrolidone, cyclohexanone, cycloheptanone, etc. can be cited.

In the case where a solvent is contained, the content of the solvent can be used in an arbitrary amount according to the coating method and the like. For example, in the case where film formation is carried out by spin coating, it is common to set the amount to 50 to 95 mass % of the entire resin composition.

The resin composition of the invention may contain various surface active agents, such as various fluorine-based surface active agents and silicone-based surface active agents, in order to improve the flowability at the time of coating application. The kind of surface active agent is not particularly limited; for example, fluorine-based surface active agents, such as MEGAFACE (registered trademark) "F142D (trade name)", "F172 (trade name)", "F173 (trade name)", "F183 (trade name)", "F445 (trade name)", "F470 (trade name)", "F475 (trade name)", and "F477 (trade name)" (which are made by DIC Corporation), and "NBX-15 (trade name)" and "FTX-218 (trade name)" (made by NEOS COMPANY LIMITED), silicone-based surface active agents, such as "BYK-333 (trade name)", "BYK-301 (trade name)", "BYK-331 (trade name)", "BYK-345 (trade name)", and "BYK-307 (trade name)" (made by BYK Japan KK), polyalkylene oxide based surface active agents, poly(meth)acrylate based surface active agents, etc. can be used. It is also permissible to use two or more species of these.

The resin composition of the invention may contain various curing agents that promote the curing of the resin composition or facilitate the curing thereof. As for the curing agent, there is no particular limitation and known agents can be used. However, as concrete examples, nitrogen-containing organic substances, silicone resin curing agents, various metal alcoholates, various metal chelate compounds, isocyanate compound, and their polymers, among others, can be cited. It is also permissible to contain a plurality of species of these. Among these, metal chelate compounds are preferably used due to the stability of the curing agents and the reliability of the cured film obtained.

The resin composition of the invention may contain an inorganic particle. As preferable concrete examples, silicon oxide, titanium oxide, zirconium oxide, barium titanate, alumina, talc, etc. can be cited; however, the inorganic particle is not limited to these. It is preferable that the primary particle diameter of these inorganic particles be 100 nm or less and more preferably 60 nm or less.

The resin composition of the invention can contain additives, such as a polymerization inhibiting agent and an antifoaming agent, according to need.

As for the solid content concentration of the resin composition of the invention, there is no particular restriction and arbitrary amounts of a solvent and a solute can be used according to the coating method and the like. For example, in the case where film formation is carried out by spin coating as described later, it is common to set the solid content concentration thereof to 5 to 50 mass %.

A representative production method for the resin composition of the invention will be described below.

For example, an (a) ultraviolet radiation absorbing agent and, according to need, a (c) compound having an alkoxy methyl group or a methylol group, and other additives are added to an arbitrary solvent. After these are dissolved by stirring, a (b) resin is added and further stirring is performed for 20 minutes to 3 hours. The obtained solution is filtered to obtain a resin composition.

The formation method for a cured film which uses the resin composition of the invention will be described with an example. The resin composition of the invention is applied onto a substrate by a known method, such as micro gravure coating, spin coating, dip coating, curtain flow coating, roll coating, spraying coating, or slit coating, and then prebaked in a heating device such as a hot plate or an oven. It is preferable that the prebaking be performed in the range of 80 to 130° C. for 30 seconds to 30 minutes and the post-prebake film thickness be 0.5 to 10 μm.

After prebaking, exposure is performed, according to need, by using an exposure machine such as a stepper, a mirror projection mask aligner (MPA), or a parallel light mask aligner (PLA). The exposure intensity is about 10 to 4000 J/m$^2$ (in terms of 365-nm wavelength exposure amount) and this light is delivered through a desired mask or not through such a mask. The exposure light source is not particularly restricted, and ultraviolet radiation, such as i radiation, g radiation, or h radiation, KrF (248 nm wavelength) laser, or ArF (193 nm wavelength) laser, among others, can be used.

After that, this film is heated in the range of 100 to 250° C. in a heating device, such as a hot plate or an oven, for about 15 minutes to 1 hour.

As for the cured film obtained from the resin composition of the invention, the film thickness thereof is not particularly restricted; however, a film thickness of 0.5 to 5 pun is preferable. Furthermore, it is preferable that the obtained cured film satisfy all average transmittance values of (I) to (III) mentioned below. Furthermore, it is particularly preferable that the transmittance be 95% or greater in the range of wavelengths longer than or equal to 500 nm. The transmittance can be adjusted by the kind and content of the (a) ultraviolet radiation absorbing agent or the heating temperature and the film thickness.

(I) An average transmittance value in the wavelength range of 300 to 360 nm is 0.1 to 5%.
(II) An average transmittance value in the wavelength range of 360 to 380 nm is 1 to 30%.
(III) An average transmittance value in the wavelength range of 400 to 500 nm is 90 to 100%.

The cured film obtained by curing the resin composition of the invention can be used for various protection films, such as protection films for cover glass, protection films for touch panels, various hard coat materials, planarization films for TFTs, overcoating for color filters, protection films for display elements, and passivation films, antireflective thin coverings, optical filters, ultraviolet radiation protective films, etc. Among these, protection films for cover glass are suitable applications because the cured film has high ultraviolet radiation-cut property, transparency, and weather resistance.

EXAMPLES

The invention will be further concretely described hereinafter with reference to examples. However, the invention is not limited by these examples. Among the compounds used in synthesis examples as well as examples, those indicated by using abbreviations are mentioned below.
PGMEA: propylene glycol monomethyl ether acetate
EDM: diethylene glycol ethyl methyl ether Synthesis Example 1: Synthesis of Acrylic Resin (b-1)

A 500 ml flask was charged with 3 g of 2,2'-azobis (isobutyronitrile) and 50 g of PGMEA. After that, 28.3 g of methacrylic acid, 32.3 g of styrene, and 26.2 g of cyclohexyl methacrylate were added. The mixed liquid was stirred at room temperature for a while. After the inside of the flask was substituted with nitrogen gas, heating and stirring were performed at 70° C. for 5 hours. Next, 13.2 g of glycidyl methacrylate, 1 g of dimethylbenzylamine, 0.2 g of p-methoxyphenol, and 100 g of PGMEA were added to the obtained solution, and heating and stirring were performed at 90° C. for 4 hours. After subsequent cooling to room temperature, PGMEA was added so that the solid content concentration of the obtained acrylic resin solution became 40 mass %. Thus, an acrylic resin solution (b-1) was obtained as a PGMEA solution. The weight-average molecular weight in terms of polystyrene measured by a GPC method was 15,500, and the double bond equivalent was 930 g/mol.

Synthesis Example 2: Synthesis of Acrylic Resin (b-2)

A 500 ml flask was charged with 3 g of 2,2'-azobis (isobutyronitrile) and 50 g of PGMEA. After that, 16.8 g of methacrylic acid, 36.4 g of benzyl methacrylate, and 36.9 g of tricyclo[5.2.1.02,6]decane-8-yl methacrylate were added. The mixed liquid was stirred at room temperature for a while. After the inside of the flask was substituted with nitrogen gas, heating and stirring were performed at 70° C. for 5 hours. Next, 9.9 g of glycidyl methacrylate, 1 g of dimethylbenzylamine, 0.2 g of p-methoxyphenol, and 100 g of PGMEA were added to the obtained solution, and heating and stirring were performed at 90° C. for 4 hour. After subsequent cooling to room temperature, PGMEA was added so that the solid content concentration of the obtained acrylic resin solution became 40 mass %. Thus, an acrylic resin solution (b-2) was obtained as a PGMEA solution. The weight-average molecular weight in terms of polystyrene measured by the GPC method was 13,000 and the double bond equivalent was 1,450 g/mol.

Synthesis Example 3: Synthesis of Acrylic Resin (b-3)

A 500 ml flask was charged with 3 g of 2,2'-azobis (isobutyronitrile) and 50 g of PGMEA. After that, 40 g of methacrylic acid, 30 g of styrene, and 30 g of methyl methacrylate were added. The mixed liquid was stirred at room temperature for a while. After the inside of the flask was substituted with nitrogen gas, heating and stirring were performed at 70° C. for 5 hours. Next, 15 g of glycidyl methacrylate, 1 g of dimethylbenzylamine, 0.2 g of p-methoxyphenol, and 100 g of PGMEA were added to the obtained solution, and heating and stirring were performed at 90° C. for 4 hour. After subsequent cooling to room temperature, PGMEA was added so that the solid content concentration of the obtained acrylic resin solution became 40 mass %. Thus, an acrylic resin solution (b-3) was obtained as a PGMEA solution. The weight-average molecular weight in terms of polystyrene measured by the GPC method was 28,000 and the double bond equivalent was 500 g/mol.

Synthesis Example 4: Synthesis of Polysiloxane (b-4)

A 500 ml three-necked flask was charged with 54.48 g (0.4 mol) of methyltrimethoxysilane, 99.15 g (0.5 mol) of phenyltrimethoxysilane, 24.64 g (0.1 mol) of 2-(3,4-epoxy-cyclohexyl)ethyltrimethoxysilane, and 163.35 g of PGMEA. While stirring was being performed at room temperature, a phosphoric acid aqueous solution obtained by dissolving 0.535 g of phosphoric acid (0.3 mass % relative to the charged monomer) in 54 g of water was added over 10 minutes. After that, the flask was immersed in an oil bath at 40° C., and stirring was performed for 30 minutes. Then, the temperature of the oil bath was increased to 115° C. over 30 minutes. One hour after the temperature increase started, the internal temperature of the solution reached 100° C. For 2 hours after that, heating and stirring were performed (the internal temperature was 100 to 110° C.). Thus, a polysiloxane solution (b-4) was obtained. Incidentally, during heating and stirring, nitrogen was passed through at 0.05 l (liter)/min. During the reaction, a total of 120 g of by-products, methanol and water, was distilled off. The solid content concentration of the obtained polysiloxane solution (b-4) was 40 mass % and the weight-average molecular weight in terms of polystyrene measured by the GPC method was 6500.

Synthesis Example 5: Synthesis of Polyimide (b-5)

In a 500 ml flask, 29.30 g (0.08 mol) of 2,2-bis(3-amino-4-hydroxyphenyl)hexafluoropropane, 1.24 g (0.005 mol) of 1,3-bis(3-aminopropyl)tetramethyl disiloxane, and 3.27 g (0.03 mol) of 4-aminophenol as a terminal sealing agent were dissolved in 239 g of N-methylpyrrolidone under dry nitrogen gas stream. 31.02 g (0.1 mol) of bis(3,4-dicarboxyphenyl)ether dianhydride was added into the solution, together with 20 g of N-methylpyrrolidone, to allow reaction at 20° C. for 1 hour and then reaction at 50° C. for 4 hours. After that, 15 g of xylene was added. While water was being azeotroped with xylene, stirring was performed 150° C. for 5 hours. After the stirring ended, the solution was let stand to cool and then poured into 3 L of water, so that a white precipitate was obtained. This precipitate was collected by filtration, washed with water three times, and dried for 20 hours by a vacuum dryer at 80° C. to obtain powder of polyimide. The weight-average molecular weight in terms of polystyrene measured by the GPC method was 14,800. The obtained powder was dissolved in PGMEA so that the solid content concentration became 40 mass %. Thus, a polyimide solution (b-5) was obtained.

The (a) ultraviolet radiation absorbing agents, the (c) compounds having an alkoxy methyl group or a methylol group, and the light stabilizing agents used in Examples and Comparative Examples are shown below.

[CHEM. 8]

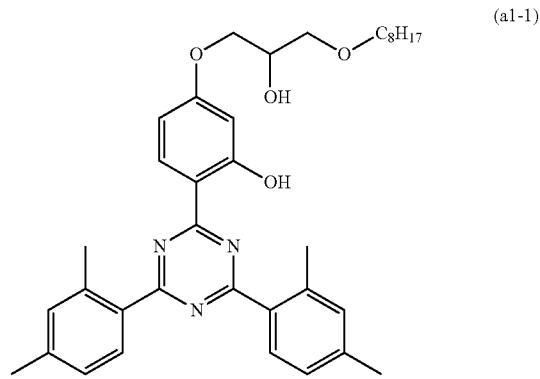

(a1-1)

-continued
(a1-2)
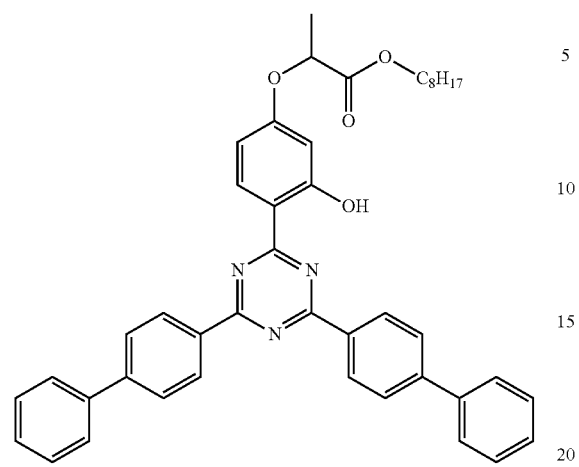
(a1-3)
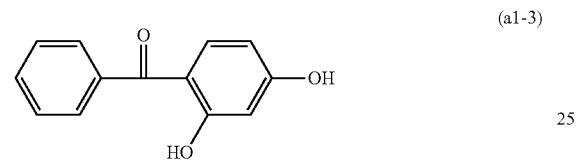
(a2-1)
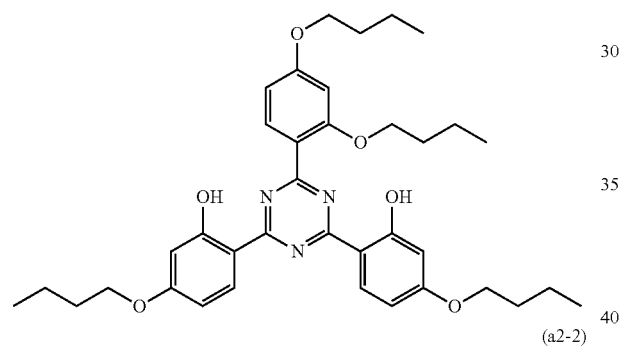
(a2-2)
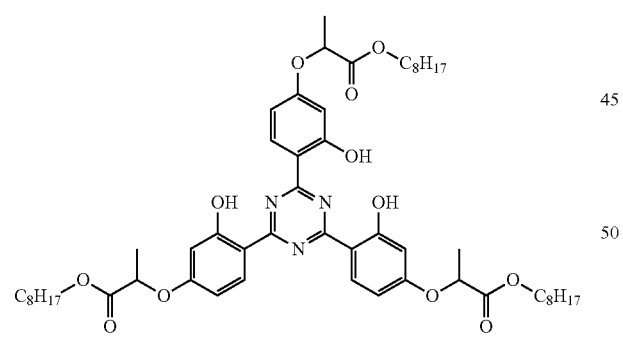
(a2-3)
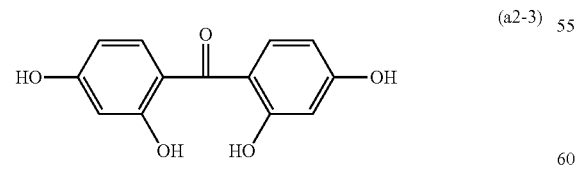
(a2-4)
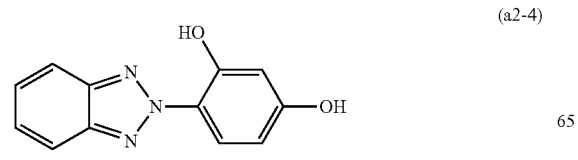
-continued
(c-1)
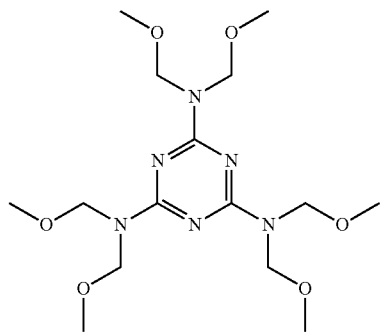
(c-2)
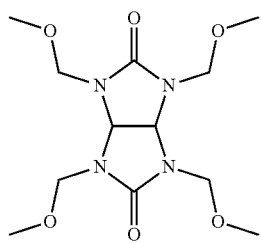
(d-1)
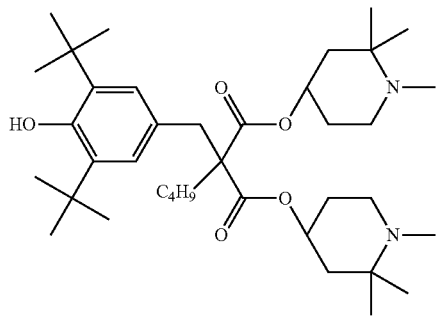
(a1-1)
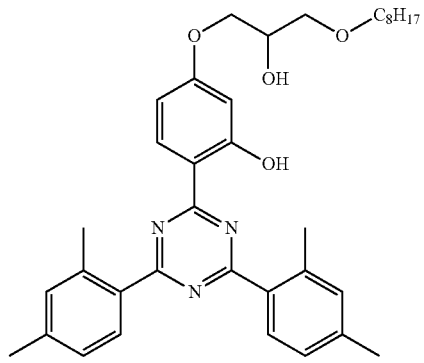

-continued

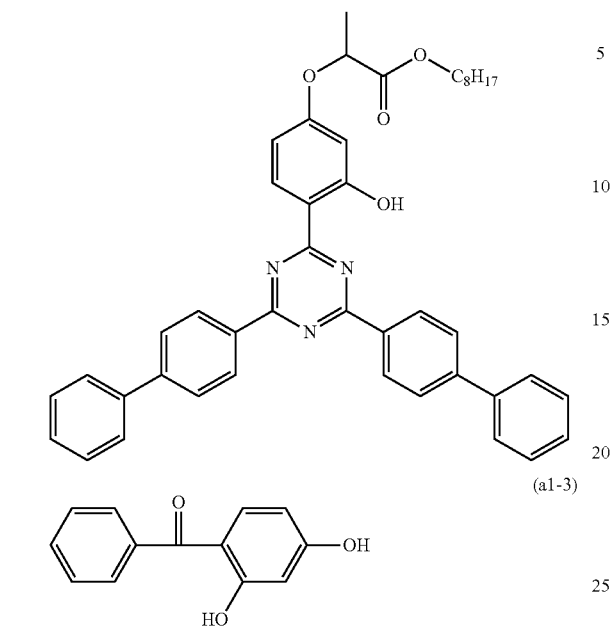

(a1-2)

(a1-3)

(a2-1)

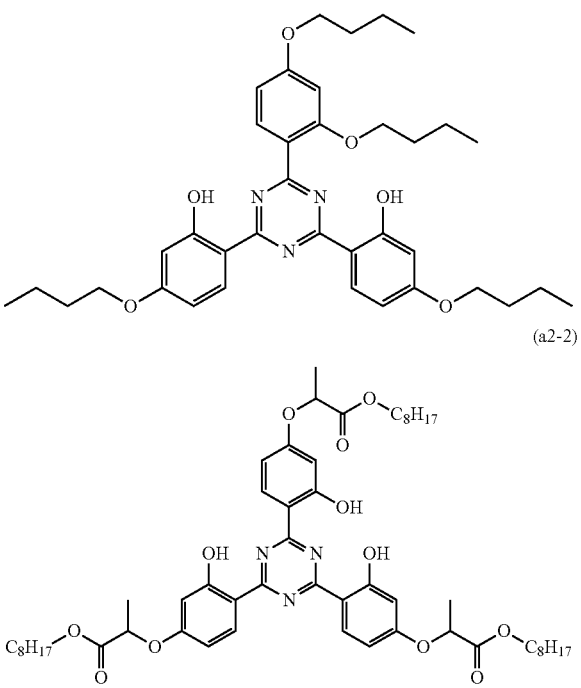

(a2-2)

(a2-3)

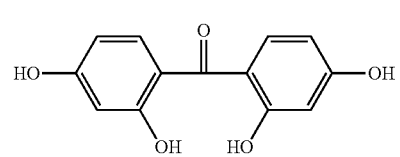

(a2-4)

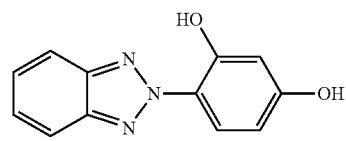

-continued

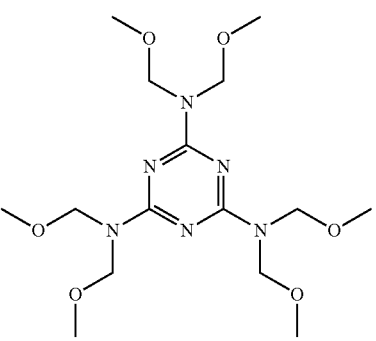

(c-1)

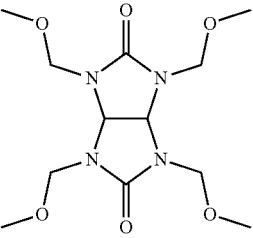

(c-2)

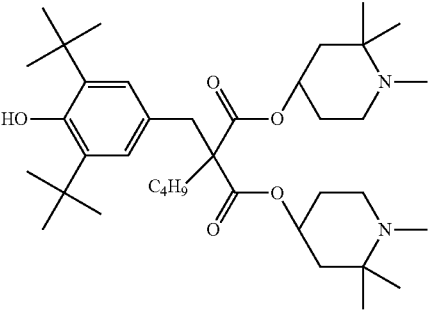

(d-1)

(a-1) Compounds Having a Greatest Absorption Maximum below 340 nm (a1-1) Tinuvin (registered trademark) 405 (trade name) (made by BASF Japan Ltd.)

(a1-2) Tinuvin (registered trademark) 479 (trade name) (made by BASF Japan Ltd.)

(a1-3) SEESORB100 (trade name) (made by SHIPRO KASEI KAISHA, LTD.)

(a-2) Compounds Having a Greatest Absorption Maximum at 340 to 380 nm (a2-1) Tinuvin (registered trademark) 460 (trade name) (made by BASF Japan Ltd.)

(a2-2) Tinuvin (registered trademark) 477 (trade name) (made by BASF Japan Ltd.)

(a2-3) DAINSORB P-6 (trade name) (made by Daiwa Fine Chemicals Co., Ltd.)

(a2-4) DAINSORB T-0 (trade name) (made by Daiwa Fine Chemicals Co., Ltd.)

(c) Compounds Having an Alkoxy Methyl Group or a Methylol Group (c-1) NIKALAC (registered trademark) MW-100LM (trade name) (made by Sanwa Chemical Co., LTD.)

(c-2) NIKALAC (registered trademark) MX-270 (trade name) (made by Sanwa Chemical Co., LTD.)

(Light Stabilizing Agent)

(d-1) Tinuvin (registered trademark) 144 (trade name) (made by BASF Japan Ltd.)

<1> Solubility Evaluation

An (a) ultraviolet radiation absorbing agent, a (b) resin, a (c) compound having an alkoxy methyl group or a methylol group, and other additives as well as a solvent were added and stirring was performed. The obtained resin composition was visually checked for whether it had any insoluble matter or turbidity. The resin compositions without abnormality were subjected to filtration by a 0.45 μm filter and then evaluations as follows.

<2> Appearance Evaluation

Each resin composition was spin-coated on a glass substrate at an arbitrary revolution speed by using a spin coater (made by Mikasa Co., Ltd., "1H-360S (trade name)"), and the substrate was prebaked at 100° C. for 2 minutes by using a hot plate (made by DAINIPPON SCREEN MFG. CO., LTD., "SCW-636 (trade name)"). The prepared film was cured in air at 230° C. for 30 minutes by using an oven (made by Yamato Scientific Co., Ltd., "DN411H (trade name)") to prepare a cured film having a film thickness of 2 μm. The post-cure film was visually observed to evaluate whether there was any abnormality.

<3> Evaluation of Transmittance (1) Average Transmittance

With regard to the cured film on the glass substrate formed by the method described above in <2>, transmittance was measured by using an ultraviolet and visible spectrophotometer (made by Shimadzu Corporation, "Multispec-1500 (trade name)"). From obtained transmittances, an average transmittance value in each one of the wavelength ranges of 300 to 360 nm, 360 to 380 nm, and 400 to 500 nm was calculated. Evaluation was carried out with reference to (I) to (III) below.

(I) The average transmittance value in the wavelength range of 300 to 360 nm is 0.1 to 5%.
(II) The average transmittance value in the wavelength range of 360 to 380 nm is 1 to 30%.
(III) The average transmittance value in the wavelength range of 400 to 500 nm is 90 to 100%.

(Criteria)
○: All of (I) to (III) are satisfied.
Δ: Any two of (I) to (III) are satisfied.
x: At most one of the conditions of (I) to (III) is satisfied.

(2) Transmittance at Wavelength of 380 nm.

Similarly to the method described above in <3> (1), transmittance was measured by using an ultraviolet and visible spectrophotometer. The transmittances at a wavelength of 380 nm were evaluated.

(Criteria)
○: The transmittance at the wavelength of 380 nm is less than 30%.
Δ: The transmittance at the wavelength of 380 nm is 30 to 50%.
x: The transmittance at the wavelength of 380 nm exceeds 50%.

<4> Evaluation of Weather Resistance

With regard to cured films formed on glass substrates by the method described above in <2>, a process with an illuminance of 0.4 W/m² (wavelength 340 nm) at a temperature of 55° C. was performed for 300 hrs. by using a Q-sun tester (made by Q-LAB, "Q-SUN XE-1 XENON TEST CHAMBER (trade name)") so that light was delivered through the glass surface. After that, transmittances were measured and average transmittance values were calculated, similarly to the method described above in <2>. The average transmittance values before and after the Q-sun process in each of the wavelength ranges of (i) 300 to 360 nm, (ii) 360 to 380 nm, and (iii) 400 to 500 nm were compared. Based on the absolute values of the differences between the average transmittance values, segmentation to 1 to 3 levels was defined as mentioned below for evaluation.

3: The difference between the values before and after the Q-sun process is less than |3|%.
2: The difference between the values before and after the Q-sun process is |3|% to |7|%.
1: The difference between the values before and after the Q-sun process exceeds |7|%.

(Criteria)
○: The segment is 3 in each of the regions of (i) to (iii).
Δ: The segment is 2 or greater in each of the regions of (i) to (iii).
x: The segment is 1 in one or more of the regions of (i) to (iii).

<5> Evaluation of Color Property

With regard to cured films formed on glass substrates by the method described above in <2>, the reflectance of each cured film regarding total reflected light was measured from the glass substrate side by using a spectrophotometer (made by Konica Minolta, Inc., "CM-2600d (trade name)"), and reflection chromaticity was measured in a CIE (L*, a*, b*) color space. From b* serving as an indicator of yellowness, color property was evaluated. Incidentally, as a light source, a D65 light source was used.

(Criteria)
○: b* is less than 0.
Δ: b* is 0 to 0.5.
x: b* exceeds 0.5.

<6> Evaluation of Frozen Storage Stability

The resin compositions were stored in a freezer at −15° C. for one month and then visually checked for whether there was any unusual change such as precipitate.

Comparative Example 1

Under a yellow lamp, 0.075 g of (a-1) "Tinuvin (registered trademark) 405 (trade name)" (made by BASF Japan Ltd.), 0.150 g of (a-2) "Tinuvin (registered trademark) 460 (trade name)" (made by BASF Japan Ltd.), 0.015 g of a light stabilizing agent "Tinuvin (registered trademark) 144 (trade name)" (made by BASF Japan Ltd.) were dissolved in 2.060 g of PGMEA and 4.250 g of EDM. Then, 0.300 g (equivalent to a concentration of 300 ppm) of a 1-mass % PGMEA solution of "BYK-333 (trade name)" (made by BYK Japan KK), which is a silicone-based surface active agent, was added, and stirring was performed. 3.150 g of the (b) acrylic resin solution (b-1) was added and stirring was performed. Next, filtration was performed with a 0.45 μm filter to obtain a resin composition (P-1). With regard to the obtained resin composition (P-1), solubility, appearance, transmittance, weather resistance, and color property were evaluated. Results are shown in Table 2. However, frozen storage of post-evaluation resin compositions resulted in formation of precipitates Comparative Example 2

A resin composition (P-2) was obtained in substantially the same manner as in Comparative Example 1, except that 0.120 g of a (c) "NIKALAC (registered trademark) MW-100LM (trade name)" (made by Sanwa Chemical Co., LTD.) was further added and the amount of the (b-1) acrylic resin solution was changed to 2.850 g. Using the obtained resin composition (P-2), evaluation was carried out in substantially the same manner as in Comparative Example 1.

However, as in Comparative Example 1, frozen storage of the post-evaluation resin composition resulted in formation of precipitate.

Example 1

A resin composition (P-3) was obtained in substantially the same manner as in Comparative Example 2, except that (a-1) "Tinuvin (registered trademark) 405 (trade name)" was replaced with "Tinuvin (registered trademark) 479 (trade name)" (made by BASF Japan Ltd.) and (a-2) "Tinuvin (registered trademark) 460 (trade name)" was replaced with 0.177 g of "Tinuvin (registered trademark) 477 (trade name)" (made by BASF Japan Ltd.). Using the obtained resin composition (P-3), evaluation was carried out in substantially the same manner as in Comparative Example 1.

Example 2

A resin composition (P-4) was obtained in substantially the same manner as in Example 1, except that the amount of (a-2) "Tinuvin (registered trademark) 477 (trade name)" was changed to 0.191 g and the amount of the (b) acrylic resin solution (b-1) was changed to 2.663 g. Using the obtained resin composition (P-4), evaluation was carried out in substantially the same manner as in Comparative Example 1.

Example 3

A resin composition (P-5) was obtained in substantially the same manner as in Example 1, except that the amount of (a-2) "Tinuvin (registered trademark) 477 (trade name)" was changed to 0.353 g and the amount of the (b) acrylic resin solution (b-1) was changed to 2.475 g. Using the obtained resin composition (P-5), evaluation was carried out in substantially the same manner as in Comparative Example 1.

Example 4

A resin composition (P-6) was obtained in substantially the same manner as in Example 1, except that the amount of (a-1) "Tinuvin (registered trademark) 479 (trade name)" was changed to 0.150 g and the amount of the (b) acrylic resin solution (b-1) was changed to 2.663 g. Using the obtained resin composition (P-6), evaluation was carried out in substantially the same manner as in Comparative Example 1.

Example 5

A resin composition (P-7) was obtained in substantially the same manner as in Example 1, except that the amount of (a-1) "Tinuvin (registered trademark) 479 (trade name)" was changed to 0.225 g, the amount of (a-2) "Tinuvin (registered trademark) 477 (trade name)" was changed to 0.088 g, and the amount of the (b) acrylic resin solution (b-1) was changed to 2.663 g. Using the obtained resin composition (P-7), evaluation was carried out in substantially the same manner as in Comparative Example 1.

Comparative Example 3

A resin composition (P-8) was obtained in substantially the same manner as in Example 1, except that the amount of (a-1) "Tinuvin (registered trademark) 479 (trade name)" was changed to 0.045 g, (a-2) "Tinuvin (registered trademark) 477 (trade name)" was replaced with 0.105 g of "DAINSORB P-6 (trade name)" (made by Daiwa Fine Chemicals Co., Ltd.), and the (b) acrylic resin solution (b-1) was replaced with 3.038 g of the acrylic resin solution (b-2). Using the obtained resin composition (P-8), evaluation was carried out in substantially the same manner as in Comparative Example 1.

Example 6

A resin composition (P-9) was obtained in substantially the same manner as in Comparative Example 3, except that (a-1) "Tinuvin (registered trademark) 479 (trade name)" was replaced with 0.015 g of "Tinuvin (registered trademark) 405 (trade name)", the amount of (a-2) "DAINSORB P-6 (trade name)" was changed to 0.075 g, the amount of "Tinuvin (registered trademark) 477 (trade name)" was changed to 0.088 g, and the amount of the (b) acrylic resin solution (b-2) was changed to 3.000 g. Using the obtained resin composition (P-9), evaluation was carried out in substantially the same manner as in Comparative Example 1.

Example 7

A resin composition (P-10) was obtained in substantially the same manner as in Comparative Example 3, except that (a-1) "Tinuvin (registered trademark) 479 (trade name)" was replaced with 0.150 g of "SEESORB100 (trade name)" (made by SHIPRO KASEI KAISHA, LTD.), (a-2) DAINSORB P-6 (trade name)" was replaced with 0.353 g of "Tinuvin (registered trademark) 477 (trade name)", and the amount of the (b) acrylic resin solution (b-2) was changed to 2.288 g. Using the obtained resin composition (P-10), evaluation was carried out in substantially the same manner as in Comparative Example 1.

Comparative Example 4

A resin composition (P-11) was obtained in substantially the same manner as in Comparative Example 3, except that (a-1) "Tinuvin (registered trademark) 479 (trade name)" was replaced with 0.075 g of "Tinuvin (registered trademark) 405 (trade name)", (a-2) "DAINSORB P-6 (trade name)" was replaced with 0.375 g of "DAINSORB T-0 (trade name)" (made by Daiwa Fine Chemicals Co., Ltd.), and the amount of the (b) acrylic resin solution (b-2) was changed to 2.288 g. Using the obtained resin composition (P-11), evaluation was carried out in substantially the same manner as in Comparative Example 1.

Example 8

A resin composition (P-12) was obtained in substantially the same manner as in Example 2, except that the (b) acrylic resin solution (b-2) was replaced with the acrylic resin solution (b-3). Using the obtained resin composition (P-12), evaluation was carried out in substantially the same manner as in Comparative Example 1.

Example 9

A resin composition (P-13) was obtained in substantially the same manner as in Example 2, except that (c) "NIKALAC (registered trademark) MW-100LM (trade name)" was replaced with "NIKALAC (registered trademark) MX-270 (trade name)" (made by Sanwa Chemical Co., LTD.). Using the obtained resin composition (P-13), evaluation was carried out in substantially the same manner as in Comparative Example 1.

Example 10

A resin composition (P-14) was obtained in substantially the same manner as in Example 2, except that the amount of (c) "NIKALAC (registered trademark) MW-100LM (trade name)" was changed to 0.045 g and the amount of the (b) acrylic resin solution (b-1) was changed to 2.850 g. Using the obtained resin composition (P-14), evaluation was carried out in substantially the same manner as in Comparative Example 1.

Example 11

A resin composition (P-15) was obtained in substantially the same manner as in Example 2, except that the amount of (c) "NIKALAC (registered trademark) MW-100LM (trade name)" was changed to 0.180 g and the amount of the (b) acrylic resin solution (b-1) was changed to 2.513 g. Using the obtained resin composition (P-15), evaluation was carried out in substantially the same manner as in Comparative Example 1.

Example 12

A resin composition (P-16) was obtained in substantially the same manner as in Example 2, except that 0.300 g of a polyfunctional monomer, dipentaerythritol hexaacrylate ("KAYARAD (registered trademark) DPHA (trade name)" made by Nippon Kayaku Co., Ltd.), was further added and the amount of the (b) acrylic resin solution (b-1) was changed to 2.475 g. Using the obtained resin composition (P-16), evaluation was carried out in substantially the same manner as in Comparative Example 1.

Example 13

A resin composition (P-17) was obtained in substantially the same manner as in Example 2, except that 0.750 g of a silicon oxide particle dispersion liquid, "NANOBYK-3651 (trade name)" (made by BYK Japan KK, the solid content concentration being 20 mass %) was further added and the amount of the (b) acrylic resin solution (b-1) was changed to 2.475 g. Using the obtained resin composition (P-17), evaluation was carried out in substantially the same manner as in Comparative Example 1.

Comparative Example 5

A resin composition (P-18) was obtained in substantially the same manner as in Example 1, except that the amount of (a-1) "Tinuvin (registered trademark) 479 (trade name)" was changed to 0.225 g and (a-2) "Tinuvin (registered trademark) 477 (trade name)" was not added. Using the obtained resin composition (P-18), evaluation was carried out in substantially the same manner as in Comparative Example 1.

Comparative Example 6

A resin composition (P-19) was obtained in substantially the same manner as in Example 1, except that the amount of (a-2) "Tinuvin (registered trademark) 477 (trade name)" was changed to 0.191 g and (a-1) "Tinuvin (registered trademark) 479 (trade name)" was not added. Using the obtained resin composition (P-19), evaluation was carried out in substantially the same manner as in Comparative Example 1.

Comparative Example 7

A resin composition (P-20) was obtained in substantially the same manner as in Example 1, except that the amount of (a-1) "Tinuvin (registered trademark) 479 (trade name)" was changed to 0.045 g, the amount of (a-2) "Tinuvin (registered trademark) 477 (trade name)" was changed to 0.053 g, and the amount of the (b) acrylic resin solution (b-1) was changed to 3.188 g. Using the obtained resin composition (P-20), evaluation was carried out in substantially the same manner as in Comparative Example 1.

Comparative Example 8

A resin composition (P-21) was obtained in substantially the same manner as in Example 1, except that the amount of (a-1) "Tinuvin (registered trademark) 479 (trade name)" was changed to 0.300 g, the amount of (a-2) "Tinuvin (registered trademark) 477 (trade name)" was changed to 0.353 g, and the amount of the (b) acrylic resin solution (b-1) was changed to 1.913 g. Using the obtained resin composition (P-21), evaluation was carried out in substantially the same manner as in Comparative Example 1. However, the post-cure film severely clouded so that transmittance, weather resistance, and color property were impossible to evaluate.

Example 14

A resin composition (P-22) was obtained in substantially the same manner as in Example 2, except that (c) "NIKALAC (registered trademark) MW-100LM (trade name)" (made by Sanwa Chemical Co., LTD.) was not added and the amount of the (b-1) acrylic resin solution was changed to 2.963 g. Using the obtained resin composition (P-22), evaluation was carried out in substantially the same manner as in Comparative Example 1.

Example 15

A resin composition (P-23) was obtained in substantially the same manner as in Example 2, except that the (b-1) acrylic resin solution was replaced with the (b-4) polysiloxane solution. Using the obtained resin composition (P-23), evaluation was carried out in substantially the same manner as in Comparative Example 1.

Example 16

A resin composition (P-24) was obtained in substantially the same manner as in Example 2, except that the (b-1) acrylic resin solution was replaced with the (b-5) polyimide solution. Using the obtained resin composition (P-24), evaluation was carried out in substantially the same manner as in Comparative Example 1.

Comparative Example 9

A resin composition (P-25) obtained in substantially the same manner as in Example 2, except that (a-2) "Tinuvin (registered trademark) 477 (trade name)" is replaced with a compound (m-1) presented as an example in Synthesis Example 2 mentioned in paragraph [0128] in Japanese Unexamined Patent Publication (Kokai) No. 2011-148865 has an insoluble matter, which makes further evaluations impossible.

[CHEM. 9]

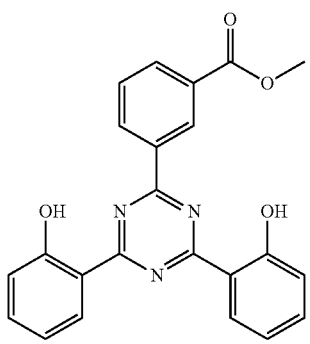

(m-1)

TABLE 1-1

| | | Solid content mass ratio (parenthesized numbers in mass %) | | |
|---|---|---|---|---|
| | | (a) Ultraviolet radiation absorbing agent | | |
| | No. | (a-1) Compound having the greatest absorption maximum below 340 nm | (a-2) Compound having the greatest absorption maximum at 340 to 380 nm | (b) Resin |
| Example 1 | P-3 | (a1-2) (5) | (a2-2) (10) | Acrylic resin (b-1) (76) |
| Example 2 | P-4 | (a1-2) (5) | (a2-2) (15) | Acrylic resin (b-1) (71) |
| Example 3 | P-5 | (a1-2) (5) | (a2-2) (20) | Acrylic resin (b-1) (66) |
| Example 4 | P-6 | (a1-2) (10) | (a2-2) (10) | Acrylic resin (b-1) (71) |
| Example 5 | P-7 | (a1-2) (15) | (a2-2) (5) | Acrylic resin (b-1) (71) |
| Example 6 | P-9 | (a1-1) (1) | (a2-2) (5) (a2-3) (5) | Acrylic resin (b-2) (80) |
| Example 7 | P-10 | (a1-3) (10) | (a2-2) (20) | Acrylic resin (b-2) (61) |
| Example 8 | P-12 | (a1-2) (5) | (a2-2) (15) | Acrylic resin (b-3) (71) |
| Example 9 | P-13 | (a1-2) (5) | (a2-2) (15) | Acrylic resin (b-1) (71) |
| Example 10 | P-14 | (a1-2) (5) | (a2-2) (15) | Acrylic resin (b-1) (76) |
| Example 11 | P-15 | (a1-2) (5) | (a2-2) (15) | Acrylic resin (b-1) (67) |
| Example 12 | P-16 | (a1-2) (5) | (a2-2) (15) | Acrylic resin (b-1) (61) |
| Example 13 | P-17 | (a1-2) (5) | (a2-2) (15) | Acrylic resin (b-1) (61) |
| Example 14 | P-22 | (a1-2) (5) | (a2-2) (15) | Acrylic resin (b-1) (79) |
| Example 15 | P-23 | (a1-2) (5) | (a2-2) (15) | polysiloxane (b-4) (71) |
| Example 16 | P-24 | (a1-2) (5) | (a2-2) (15) | polyimide (b-5) (71) |
| Comparative Example 1 | P-1 | (a1-1) (5) | (a2-1) (10) | Acrylic resin (b-1) (84) |
| Comparative Example 2 | P-2 | (a1-1) (5) | (a2-1) (10) | Acrylic resin (b-1) (76) |
| Comparative Example 3 | P-8 | (a1-2) (3) | (a2-3) (7) | Acrylic resin (b-2) (81) |
| Comparative Example 4 | P-11 | (a1-1) (5) | (a2-4) (25) | Acrylic resin (b-2) (61) |
| Comparative Example 5 | P-18 | (a1-2) (15) | — | Acrylic resin (b-1) (76) |
| Comparative Example 6 | P-19 | — | (a2-2) (15) | Acrylic resin (b-1) (76) |
| Comparative Example 7 | P-20 | (a1-2) (3) | (a2-2) (3) | Acrylic resin (b-1) (85) |
| Comparative Example 8 | P-21 | (a1-2) (20) | (a2-2) (20) | Acrylic resin (b-1) (51) |
| Comparative Example 9 | P-25 | (a1-2) (5) | (m-2) (15) | Acrylic resin (b-1) (71) |

TABLE 1-2

| | Solid content mass ratio (parenthesized numbers in mass %) | | | |
|---|---|---|---|---|
| | (c) Compound having an alkoxy methyl group or a methylol group | Light stabilizing agent | Other additives Others | Surface active agent (added to the total amount of solution) |
| Example 1 | (c-1) (8) | (d-1) (1) | — | BYK-333 (300 ppm) |
| Example 2 | (c-1) (8) | (d-1) (1) | — | BYK-333 (300 ppm) |
| Example 3 | (c-1) (8) | (d-1) (1) | — | BYK-333 (300 ppm) |
| Example 4 | (c-1) (8) | (d-1) (1) | — | BYK-333 (300 ppm) |
| Example 5 | (c-1) (8) | (d-1) (1) | — | BYK-333 (300 ppm) |
| Example 6 | (c-1) (8) | (d-1) (1) | — | BYK-333 (300 ppm) |
| Example 7 | (c-1) (8) | (d-1) (1) | — | BYK-333 (300 ppm) |
| Example 8 | (c-1) (8) | (d-1) (1) | — | BYK-333 (300 ppm) |
| Example 9 | (c-2) (8) | (d-1) (1) | — | BYK-333 (300 ppm) |
| Example 10 | (c-1) (3) | (d-1) (1) | — | BYK-333 (300 ppm) |
| Example 11 | (c-1) (12) | (d-1) (1) | — | BYK-333 (300 ppm) |
| Example 12 | (c-1) (8) | (d-1) (1) | DPHA (10) | BYK-333 (300 ppm) |
| Example 13 | (c-1) (8) | (d-1) (1) | NANOBYK-3651 (10) | BYK-333 (300 ppm) |
| Example 14 | — | (d-1) (1) | — | BYK-333 (300 ppm) |
| Example 15 | (c-1) (8) | (d-1) (1) | — | BYK-333 (300 ppm) |
| Example 16 | (c-1) (8) | (d-1) (1) | — | BYK-333 (300 ppm) |
| Comparative Example 1 | — | (d-1) (1) | — | BYK-333 (300 ppm) |
| Comparative Example 2 | (c-1) (8) | (d-1) (1) | — | BYK-333 (300 ppm) |
| Comparative Example 3 | (c-1) (8) | (d-1) (1) | — | BYK-333 (300 ppm) |
| Comparative Example 4 | (c-1) (8) | (d-1) (1) | — | BYK-333 (300 ppm) |
| Comparative Example 5 | (c-1) (8) | (d-1) (1) | — | BYK-333 |

TABLE 1-2-continued

| | Solid content mass ratio (parenthesized numbers in mass %) | | | |
|---|---|---|---|---|
| | (c) Compound having an alkoxy methyl group or a methylol group | Other additives | | Surface active agent (added to the total amount of solution) |
| | | Light stabilizing agent | Others | |
| Example 5 | (8) | (1) | — | (300 ppm) |
| Comparative Example 6 | (c-1) (8) | (d-1) (1) | — | BYK-333 (300 ppm) |
| Comparative Example 7 | (c-1) (8) | (d-1) (1) | — | BYK-333 (300 ppm) |
| Comparative Example 8 | (c-1) (8) | (d-1) (1) | — | BYK-333 (300 ppm) |
| Comparative Example 9 | (c-1) (8) | (d-1) (1) | — | BYK-333 (300 ppm) |

TABLE 2-1

| | Solubility Determination | Appearance Determination | Average transmittance | | | | Transmittance at wavelength of 380 nm | |
|---|---|---|---|---|---|---|---|---|
| | | | (I) Average transmittance value at 300 to 360 nm (%) | (II) Average transmittance value at 360 to 380 nm (%) | (III) Average transmittance value at 400 to 500 nm (%) | Determination | Transmittance at 380 nm (%) | Determination |
| Example 1 | No abnormality | No abnormality | 3.4 | 12.6 | 97.1 | ○ | 35.2 | Δ |
| Example 2 | No abnormality | No abnormality | 3.0 | 10.1 | 96.4 | ○ | 24.7 | ○ |
| Example 3 | No abnormality | No abnormality | 2.9 | 7.1 | 95.9 | ○ | 16.1 | ○ |
| Example 4 | No abnormality | No abnormality | 1.8 | 14.6 | 97.4 | ○ | 32.1 | Δ |
| Example 5 | No abnormality | No abnormality | 3.2 | 20.8 | 97.6 | ○ | 47.1 | Δ |
| Example 6 | No abnormality | No abnormality | 3.8 | 10.8 | 94.1 | ○ | 27.6 | ○ |
| Example 7 | No abnormality | Slight cloudiness | 3.0 | 6.5 | 96.3 | ○ | 15.3 | ○ |
| Example 8 | No abnormality | Slight cloudiness | 3.1 | 10.9 | 96.9 | ○ | 23.2 | ○ |
| Example 9 | No abnormality | No abnormality | 3.5 | 11.0 | 96.6 | ○ | 26.7 | ○ |
| Example 10 | No abnormality | No abnormality | 3.8 | 10.6 | 96.7 | ○ | 27.3 | ○ |
| Example 11 | No abnormality | No abnormality | 3.0 | 9.8 | 96.4 | ○ | 24.9 | ○ |
| Example 12 | No abnormality | Slight cloudiness | 2.8 | 10.3 | 96.5 | ○ | 24.1 | ○ |
| Example 13 | No abnormality | No abnormality | 3.2 | 10.7 | 97.0 | ○ | 26.3 | ○ |
| Example 14 | No abnormality | No abnormality | 3.5 | 11.1 | 97.3 | ○ | 25.6 | ○ |
| Example 15 | No abnormality | Slight cloudiness | 3.3 | 6.5 | 95.8 | ○ | 11.5 | ○ |
| Example 16 | No abnormality | Slight cloudiness | 0.9 | 2.8 | 94.3 | ○ | 9.2 | ○ |
| Comparative Example 1 | No abnormality | No abnormality | 1.7 | 17.4 | 96.6 | ○ | 45.1 | Δ |
| Comparative Example 2 | No abnormality | No abnormality | 2.0 | 16.9 | 96.5 | ○ | 44.6 | Δ |
| Comparative Example 3 | No abnormality | No abnormality | 3.9 | 19.8 | 90.4 | ○ | 28.4 | ○ |
| Comparative Example 4 | No abnormality | Slight cloudiness | 3.4 | 29.8 | 97.8 | ○ | 55.3 | x |
| Comparative Example 5 | No abnormality | No abnormality | 2.8 | 44.5 | 98.9 | Δ | 76.1 | x |
| Comparative Example 6 | No abnormality | No abnormality | 6.7 | 12.2 | 95.2 | Δ | 25.1 | ○ |
| Comparative Example 7 | No abnormality | No abnormality | 33.7 | 43.5 | 98.0 | x | 59.9 | x |
| Comparative Example 8 | No abnormality | Clouded | | | | | | |
| Comparative Example 9 | Insoluble matter present | | | | | | | |

TABLE 2-2

| | Weather resistance | | | | | | |
|---|---|---|---|---|---|---|---|
| | (i) Change in average transmittance value at 300 to 360 nm | (ii) Change in average transmittance value at 360 to 380 nm | (iii) Change in average transmittance value at 400 to 500 nm | Determination | Color property b* | Determination | Frozen storage stability |
| Example 1 | 3 | 3 | 3 | ○ | −0.58 | ○ | No abnormality |
| Example 2 | 3 | 3 | 3 | ○ | −0.57 | ○ | No abnormality |
| Example 3 | 3 | 3 | 3 | ○ | −0.54 | ○ | No abnormality |
| Example 4 | 3 | 3 | 3 | ○ | −0.58 | ○ | No abnormality |
| Example 5 | 3 | 3 | 3 | ○ | −0.59 | ○ | No abnormality |
| Example 6 | 2 | 3 | 3 | Δ | 0.13 | Δ | No abnormality |
| Example 7 | 3 | 3 | 3 | ○ | −0.56 | ○ | No abnormality |
| Example 8 | 2 | 2 | 2 | Δ | −0.5.7 | ○ | No abnormality |
| Example 9 | 2 | 3 | 3 | Δ | −0.58 | ○ | No abnormality |
| Example 10 | 2 | 2 | 3 | Δ | −0.57 | ○ | No abnormality |
| Example 11 | 3 | 3 | 3 | ○ | −0.59 | ○ | No abnormality |
| Example 12 | 3 | 3 | 2 | Δ | −0.58 | ○ | No abnormality |
| Example 13 | 3 | 3 | 3 | ○ | −0.60 | ○ | No abnormality |
| Example 14 | 2 | 2 | 3 | Δ | −0.60 | ○ | No abnormality |
| Example 15 | 3 | 3 | 3 | ○ | −0.65 | ○ | No abnormality |
| Example 16 | 2 | 2 | 2 | Δ | −0.30 | ○ | No abnormality |
| Comparative Example 1 | 2 | 2 | 2 | Δ | −0.34 | ○ | Precipitation |
| Comparative Example 2 | 3 | 3 | 3 | ○ | −0.37 | ○ | Precipitation |
| Comparative Example 3 | 2 | 2 | 2 | Δ | 0.56 | x | No abnormality |
| Comparative Example 4 | 3 | 3 | 3 | ○ | −0.78 | ○ | No abnormality |
| Comparative Example 5 | 3 | 2 | 3 | Δ | −0.67 | ○ | No abnormality |
| Comparative Example 6 | 1 | 1 | 2 | x | −0.55 | ○ | No abnormality |
| Comparative Example 7 | 1 | 1 | 2 | x | −0.71 | ○ | No abnormality |
| Comparative Example 8 | | | | | | | |
| Comparative Example 9 | | | | | | | |

INDUSTRIAL APPLICABILITY

The cured film obtained by curing the resin composition of the invention can be suitably used for various hard coat materials, such as protection films for cover glass and protection films for touch panels, and also for planarization films for TFTs of liquid crystal and organic EL displays, overcoating for color filters, protection films for display elements, antireflection films, antireflective thin coverings, optical filters, ultraviolet radiation protective films, etc.

The invention claimed is:

1. A resin composition comprising:

(a) an ultraviolet radiation absorbing agent; and (b) an acrylic resin, the ultraviolet radiation absorbing agent comprising at least two species as follows:

(a-1) a compound having a greatest absorption maximum below 340 nm; and (a-2) a compound having a greatest absorption maximum at 340 to 380 nm, wherein the compound of (a-2) comprises a compound represented by general formula (1) and a sum content of (a-1) and (a-2) is 10 to 30 mass % of a total amount of solid content,

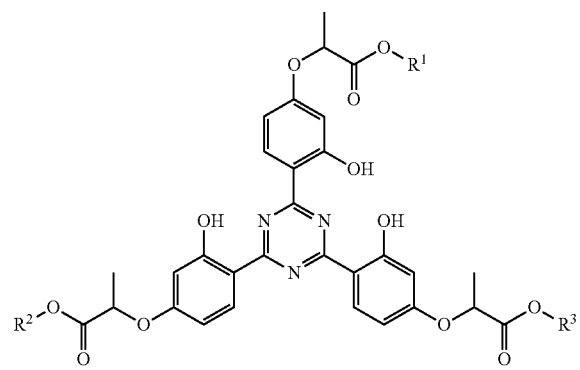

(1)

wherein $R^1$ to $R^3$ each independently is a hydrocarbon group having a carbon number of 1 to 10, and wherein a double bond equivalent of the (b) acrylic resin is in a range of 700 to 2,300 g/mol.

2. The resin composition according to claim 1, wherein a mass ratio between the content of the compound of (a-1) and the content of the compound of (a-2) is in a range of (a-1):(a-2)=1:1 to 1:10.

3. The resin composition according to claim 1, wherein the (b) resin has a carboxyl group.

4. The resin composition according to claim 1, further comprising (c) a compound having an alkoxy methyl group or a methylol group.

5. The resin composition according to claim 4, wherein the (c) compound having an alkoxy methyl group or a methylol group has a group represented by general formula (2):

wherein:
$R^4$ is a hydrogen atom or a univalent hydrocarbon group having a carbon number of 1 to 6,
x is 1 or 2,
y is 0 or 1, and
x+y is 2.

6. The A resin composition comprising:
(a) an ultraviolet radiation absorbing agent;
(b) a resin; and
(c) a compound having an alkoxy methyl group or a methylol group,
the ultraviolet radiation absorbing agent comprising at least two species as follows:
(a-1) a compound having a greatest absorption maximum below 340 nm; and
(a-2) a compound having a greatest absorption maximum at 340 to 380 nm,
wherein the compound of (a-2) comprises a compound represented by general formula (1) and a sum content of (a-1) and (a-2) is 10 to 30 mass % of a total amount of solid content,

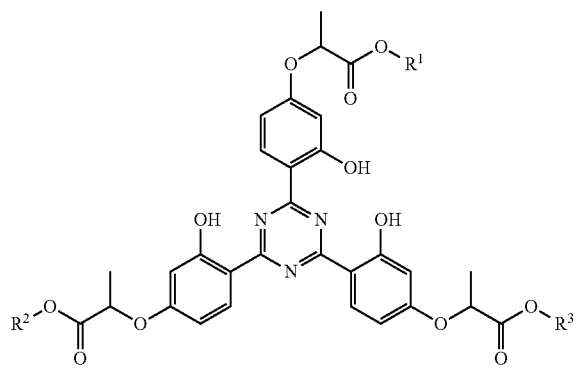

wherein $R^1$ to $R^3$ each independently is a hydrocarbon group having a carbon number of 1 to 10 and
wherein based on the total amount of solid content:
the (a-1) compound is present in an amount of 1 to 10 mass %;
the (a-2) compound is present in an amount of 7 to 25 mass %;
the (b) resin is present in an amount of 50 to 85 mass %; and
the (c) compound is present in an amount of 0.5 to 15 mass %.

7. A cured film provided by curing the resin composition according to claim 1.

8. The cured film according to claim 7, whose average transmittance values satisfy all of (I) to (III) as follows:
(I) an average transmittance value in a wavelength range of 300 to 360 nm is 0.1 to 5%;
(II) an average transmittance value in a wavelength range of 360 to 380 nm is 1 to 30%; and
(III) an average transmittance value in a wavelength range of 400 to 500 nm is 90 to 100%.

9. The cured film according to claim 8, whose film thickness is 0.5 to 5 μm.

10. A production method for a cured film in which the cured film is formed by applying the resin composition according to claim 1 onto a substrate and performing a heating treatment at 100 to 250° C.

11. A display device comprising the cured film according to claim 7.

12. A cover glass comprising the cured film according to claim 7.

13. A color filter comprising the cured film according to claim 7.

14. A touch panel comprising the cured film according to claim 7.

15. A cured film provided by curing the resin composition according to claim 6.

16. A production method for a cured film in which the cured film is formed by applying the resin composition according to claim 6 onto a substrate and performing a heating treatment at 100 to 250° C.

17. A display device comprising the cured film according to claim 15.

18. A cover glass comprising the cured film according to claim 15.

19. A color filter comprising the cured film according to claim 15.

20. A touch panel comprising the cured film according to claim 15.

* * * * *